United States Patent [19]

Nakajima et al.

[11] Patent Number: 4,827,214

[45] Date of Patent: May 2, 1989

[54] METHOD FOR MEASURING LOSSES OF A MAGNETIC CORE

[75] Inventors: Shin Nakajima; Kiyotaka Yamauchi, both of Kumagaya, Japan

[73] Assignee: Hitachi Metals, Ltd., Tokyo, Japan

[21] Appl. No.: 99,619

[22] Filed: Sep. 22, 1987

[30] Foreign Application Priority Data

Sep. 24, 1986 [JP] Japan .................... 61-225190

[51] Int. Cl.⁴ .......................................... G01R 33/14
[52] U.S. Cl. ...................................... 324/222; 324/239
[58] Field of Search ............... 324/210, 211, 212, 222, 324/223, 239

[56] References Cited

U.S. PATENT DOCUMENTS 4,044,302 8/1977 Mayberry ..................... 324/223

OTHER PUBLICATIONS

"Magnetic Application Engineering" by Marakami, p. 47, line 14—p. 48, line 8, published by Asakura Shoten, 1984.

Primary Examiner—Reinhard J. Eisenzopf
Assistant Examiner—Walter E. Snow
Attorney, Agent, or Firm—Finnegan, Henderson, Farabow, Garrett & Dunner

[57] ABSTRACT

A novel method and system for measuring AC magnetic characteristics is disclosed, in which the loss of a magnetic core is measured by defining the change rate of magnetic flux density, and for this purpose, the duration of a voltage induced in the coil of an object magnetic core during the gate period is detected and controlled by an input voltage, a reset current and a load resistor.

9 Claims, 12 Drawing Sheets

METHOD FOR MEASURING LOSSES OF A MAGNETIC CORE

BACKGROUND OF THE INVENTION

The present invention relates to a method and a system for measuring the AC magnetic characteristics of a magnetic core used for a magnetic amplifier, or more in particular such a method and a system improved in loss. More specifically, the present invention provides a method and a system in which the change rate of magnetic flux density is defined and measured by rectangular wave drive thereby to obtain a measurement easily that can be directly utilized for actual design of a magnetic amplifier, etc.

DESCRIPTION OF TERMS USED WITH THE INVENTION (1) Magnetic amplifier, saturable reactor A device using a saturable reactor (a magnetic element the impedance of which is variable with a reset current) to permit control of the AC power flowing in a load with a low-energy DC control signal. A saturable reactor is generally an iron core reactor having a control winding, the current in which is changed to change the saturation degree of the iron core thereby to change the reactance of the AC winding. In the present invention, the "rectangular wave drive" means a process of using a rectangular wave as a current supplied through the control winding, as the reason thereof will be described later.

(2) Operating principle of magnetic amplifier

FIGS. 3 to 5 show a basic circuit, a magnetization curve, etc. of a magnetic amplifier of half-wave type. First, the basic circuit shown in FIG. 3 includes a gate circuit having an output winding $N_L$ of a saturable reactor SR, a load $R_L$, an AC current $i_L$ and a diode D, and a control circuit having a control winding $N_C$ for the SR, an impedance $Z_C$ for the control circuit and a DC signal voltage $E_C$.

The operating principle of the above-mentioned basic circuit will be explained. FIG. 4 shows a magnetization curve of the operation of the saturable reactor SR in the basic circuit. In the case where the saturable reactor SR functions as a magnetic amplifier, it operates plotting what is called a non-symmetric "minor loop" shown by solid line in the drawing. Specifically, in FIG. 3, a reset period of D to E to A in which the diode D of the gate circuit is biased reversely and a gate period of A to B to C to D during which the diode D is biased in forward direction appears alternately in half cycles of the power frequency. The pattern of this alternation is indicated by waveforms shown in FIG. 5. In FIG. 5, points A to E correspond to the points A to E in FIG. 4 respectively. It is also seen that the magnetization force $H+H_{Lm}$ is slightly advanced from the electromotive force of the AC power supply $e_g$.

During the reset period, the magnetic flux density of the saturable reactor SR is reset from points E to A by the control magnetization force due to the control signal $E_C$ given as $$H = \frac{N_c \cdot I_c}{l_e} \quad (1)$$

$l_e$: Average magnetic path length of SR

During the gate period, the diode D is biased in the forward direction, so that the $N_L$ winding of the saturable reactor SR is supplied with a half-wave sinusoidal wave voltage. The magnetic flux density of SR undergoes a variation from point A to point E with a maximum value at C determined by the crest value of the magnetization force expressed as $$H_{Lm} = \frac{N_L \cdot i_{Lm}}{l_e} \quad (2)$$

As a result, a voltage shown by $V_{NL}$ of FIG. 5 is induced in the $N_L$ winding of the saturable reactor SR, thus preventing the flow of $i_L$ for a period of $T_b$. Specifically, $I_C$ is changed by changing the signal voltage $E_C$ of the control circuit, so that the control magnetization force H expressed by equation (1) is changed, thereby making it possible to subject the current $i_L$ flowing in the load $R_L$, and hence, the supplied power to phase control.

For detailed explanation of the operating principle of a magnetic amplifier, see "Magnetic Amplifier" by H. F. Storm, Corona Publication, p.p. 313 to 323, and "Magnetic Application Engineering" by Murakami, Asakura Shoten, p.p. 26 to 32.

A configuration as shown in FIG. 6 is generally used for measuring the loss of the magnetic core made of mild magnetic material such as soft ferrite, permalloy or amorphus. In FIG. 6, reference numeral 1 designates an AC power supply (labelled AG in FIG. 6), and numeral 2 a magnetic core to be measured, which is excited by an exciting winding 6 mounted thereon. The magnetic core loss is determined by applying the terminal voltage $V_3$ of a non-inductive resistor 3 proportional to the exciting current $i_{ex}$ and the terminal voltage $V_6$ of the exciting winding 6 to a multiplication-type voltmeter 5 (usually the U-Function Meter SEM-4603 of Norma). The amount of the operating magnetic fluxes $\Delta\phi$, on the other hand, is detected by a mean-value voltmeter 4 (labelled VMin FIG. 6), in view of the fact that $\Delta\phi$ can be determined indirectly as an integrated value of v from the relational expression $\Delta\phi = A\phi B = \int v dt$. In the circuit of FIG. 7, in the case where the copper loss attributable to the resistance of the exciting winding 6 of the magnetic core 2 to be measured is not ignorable as compared with the magnetic core loss, a detection winding 7 is provided on the object magnetic core 2 as shown in FIG. 7, so that the terminal voltage $V_7$ of the detection winding 7 in place of the terminal voltage $V_6$ of the exciting coil 6 is applied to the multiplication-type voltmeter 5 thereby to measure the magnetic core loss. FIG. 8 shows waveforms produced at various parts when conditions (for sinusoidal wave of magnetic fluxes) are satisfied to realize a sinusoidal voltage waveform of the AC power supply in the measurement circuit of FIGS. 6 and 7 and the waveform of the magnetic fluxes $\phi$ of the excitation coil 6 or detection coil 7 of the object magnetic core 2 is sinusoidal. It is seen that the change rate of the magnetic flux density B changes every moment. In such a case as this, this method of measurement is not desirable since the coercive force in the AC magnetic characteristics is known to depend on the change rate of magnetic fluxes.

FIG. 9 shows a B-H hysteresis loop for operation of the object magnetic core 2 when measurement is obtained from the measurement circuit of FIGS. 6 and 7. The operation hysteresis loop, which forms a loop symmetric with respect to the origin 0 in the B-H loop, is called an AC major hysteresis loop. (For more details of the aforementioned method of measurement, see "A Method of Testing Ferrite Magnetic Core for Power Application EMAS-5003", Standard Specifications of Japan Electronic Materials Industrial Association)

Even though the magnetic core loss measured by the above-mentioned method is applicable to the design of the pole-mounted transformer or inverter transformer with a magnetic core performing the major loop operation, applications thereof are difficult to the design of the forward converter transformer, flyback transformer or the saturable reactor for magnetic amplifier which performs a minor loop operation not symmetric with respect to the origin O of the B-H loop. Especially, the magnetic core operation of the saturable reactor for magnetic amplifier plots a minor loop asymmetric with respect to the origin including the saturation area of the first quadrant in the B-H loop shown in FIG. 4.

The measurement with a circuit shown in FIGS. 6 and 7 is impossible, but it is necessary to use a measurement circuit as shown in FIG. 10 in which the control magnetization force H is switchable between positive and negative. This measurement circuit, as will be described below, performs quite the same operation as the above-mentioned magnetic amplifier, and is divided into a gate circuit and a reset circuit. The gate circuit includes a single-polarity rectangular wave generator circuit 9 (labelled RWG in FIG. 10), a gate winding 6 with the number $N_L$ of turns of the object magnetic core 2 and a non-inductive load resistor 17. The gate current $i_L$ is caused to flow only in the direction shown. The reset circuit, on the other hand, includes a variable DC power supply 10 (labelled DC in FIG. 10), a control circuit impedance 11 (labelled CCl in FIG. 10), a reset winding 8 with the number $N_C$ of turns of the object magnetic core 2 and a non-inductive resistor 12. The reset current $I_C$ is caused to flow only in the direction shown.

Assume that the control circuit impedance 11 is set to a value sufficiently large as compared with the impedance of the reset winding 8 of the object magnetic core. As a result, a constant-current power supply is assumed, thus making possible a constant-current resetting. In the opposite way, a voltage resetting is made possible.

In FIG. 10, numeral 14 designates a loss meter (labelled LM in FIG. 10) including a waveform memory and a computer, and numeral 4 a mean value voltmeter for detecting magnetic fluxes, which voltmeter is connected to the detecting coil 7 of the object magnetic core 2. The magnetic core loss $P_{CG}$ during the gate period (the period Ton in FIG. 12) is obtained by turning the change-over switch 13 to 16 side and by applying the terminal voltage $V_{17}$ of the non-inductive load resistor 17 and the terminal voltage $V_7$ of the detection coil 7 of the object magnetic core 2 to the loss meter 14. The magnetic core loss $P_{CR}$ during the reset period (the period Toff in FIG. 12) on the other hand, is obtained by turning the change-over switch 13 to 15 side and by applying the terminal voltage $V_{12}$ of the non-inductive resistor 12 and the terminal voltage $V_7$ of the detection coil 7 of the object magnetic core 2 to the loss meter 17. The magnetic core loss $P_C$ is thus given as $$P_C \frac{T_{ON}}{T_P} \cdot P_{CR} + \frac{T_{off}}{T_T} \cdot P_{CR} \quad (3)$$

FIGS. 13 and 14 show waveforms produced at various parts and an operation B-H hysteresis loop in the case where a given reset current Ic is flowing with the control circuit impedance Il rendered sufficiently large as compared with the impedance of the reset coil 8 (constant current reset condition) in the circuit of FIG. 10. In this case, the control magnetization force is expressed as $$H = \frac{N_c \cdot I_c}{l_e} \quad (1)$$

where the average magnetic path length of the object magnetic core is $l_e$, and the crest value of the gate magnetization force is given as $$H_{Lm} = \frac{N_L \cdot \left( I_{Lm} - \frac{H \cdot l_e}{N_c} \right)}{l_e} \quad (4)$$

where $I_{Lm}$ is the crest value of the gate current $i_L$. If $H_{Lm} > H$, $$H_{Lm} \approx \frac{N_L \cdot I_{Lm}}{l_e} \quad (5)$$

On the other hand, Tb in FIG. 12 is given as $$Tb = \frac{N_L \cdot A_e \cdot \Delta B_{cm}}{V_1} \quad (6)$$

where
  $A_e$: Effective sectional area of the object magnetic core,
  $\Delta B_{cm}$: Operating magnetic flux density of the object magnetic core, and
  $V_1$: Crest value of single-polarity rectangular wave The amount of the operating magnetic flux density $\Delta B_{cm}$ of the object magnetic core is controlled by the reset current Ic.

The circuit of FIG. 11 is additionally provided with a function as a reset coil for the gate coil of the object magnetic core 2. This circuit operates exactly the same way as the circuit of FIG. 10. In the circuit under consideration, the magnetic core loss is obtained by supplying the multiplication-type voltmeter with the terminal voltage $V_3$ of the non-inductive resistor 3 proportional to the reset current Ic and the gate current $i_L$ and the terminal voltage $V_7$ of the detection coil 7 of the object magnetic core 2.

As seen from above, the well-known method of measuring the magnetic characteristics of a magnetic core used for the magnetic amplifier which performs what is called the minor loop operation is called the control magnetization curve (CMC). (See "Magnetic Application Engineering" by Murakami, p.p. 42 to 59, published by Asakura Shoten, 1984)

A conventional method of measuring the magnetic core loss called CMC has the disadvantage that in the case of plotting a minor loop with only the first quadrant saturated in the B-H loop as in a saturable reactor magnetic core for the magnetic amplifier, the result of measurement of the magnetic core loss which varies with the rate of magnetic flux change depends to a large measure on the measurement conditions. As a consequence, such a conventional method, though effective as a method of comparison of characteristics, is not directly applicable to the design of an actual saturable reactor. The design and evaluation of a magnetic amplifier using a saturable reactor, which has so far been difficult, has been unavoidably conducted by an empirical technique, with the result that a great burden is imposed on the designers on the one hand and it has been impossible to conduct a satisfactory quality control, or especially, the acceptance inspection of the saturable reactor core.

SUMMARY OF THE INVENTION

The object of the present invention is to provide a method and a system for measuring the magnetic core loss which take measurement conditions into consideration in order to obviate the above-described disadvantages of the prior art and which is directly applicable to the design of an actual saturable reactor.

According to the present invention, there is provided a method of measuring AC magnetic characteristics for measuring the magnetic core loss of a magnetic amplifier in order to obviate the disadvantages of the above-mentioned prior art called CMC, wherein the rate of magnetic flux density change is defined by rectangular wave drive, thereby making practicable the measurement of the magnetic core loss that can be directly applicable to the design of an actual saturable reactor taking the measurement conditions into consideration.

More specifically, there is provided a method of measuring the AC magnetic characteristics for measuring the magnetic core loss in the operation of a magnetic amplifier under rectangular wave drive, characterized in that the loss of a magnetic core is measured by defining the change rate of magnetic flux density. It is especially important to define the change rate of the magnetic flux density during the gate period.

The method of measurement according to the present invention relates to an improvement in the prior art CMC (an abbreviation of "Control Magnetization Curve" as mentioned above), which utilizes the rectangular wave drive, will hereinafter be referred to as "RCMC". The rectangular wave used for this purpose may of course be substantial, and a slight variation in waveform does not have any substantial effect on the present invention.

DESCRIPTION OF THE PREFERRED EMBODIMENT

Embodiments of the present invention (RCMC method) will be explained in detail below. (Embodiment 1)

Figure 1:
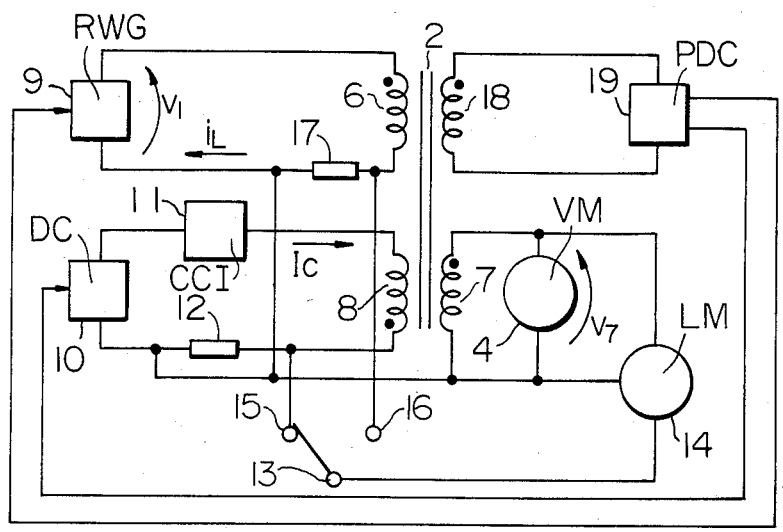
FIG. 1 is a diagram showing a configuration for measuring the magnetic core loss according to the present invention.
Figure 10:
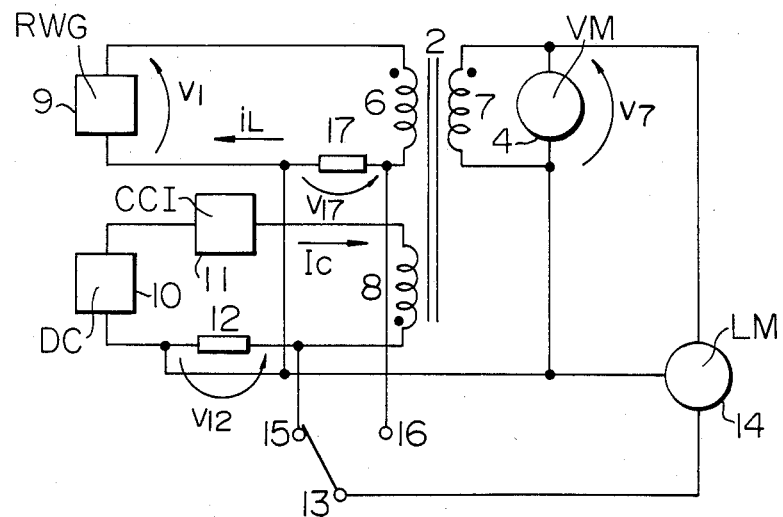
FIG. 10 is a diagram showing a conventional magnetic core loss measurement circuit for the operation of a magnetic amplifier.
Figure 11:
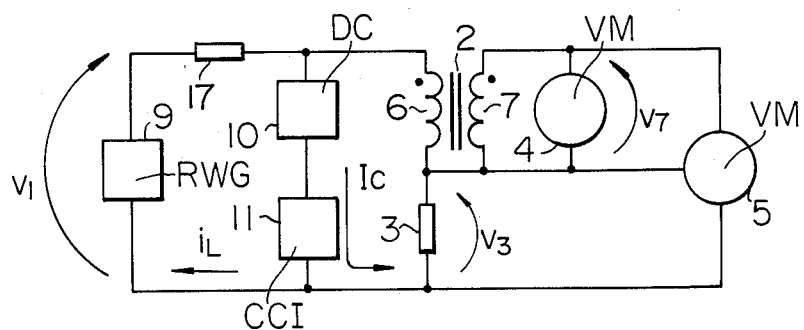
FIG. 11 is a similar circuit diagram for measuring the magnetic core loss according to the prior art.
Figure 12:
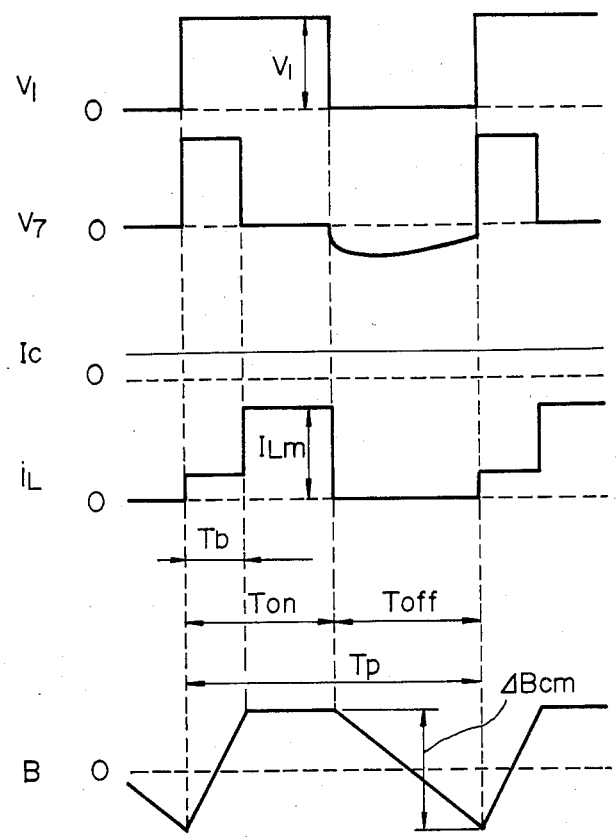
FIG. 12 shows waveforms produced at various parts of the circuit of FIG. 10.
Figure 13:
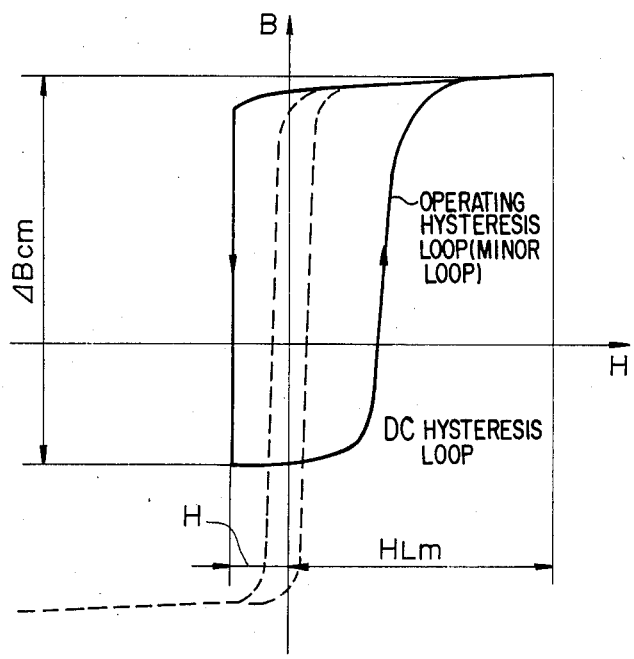
FIG. 13 is a hysteresis curve caused in the aforementioned case.
Figure 17:
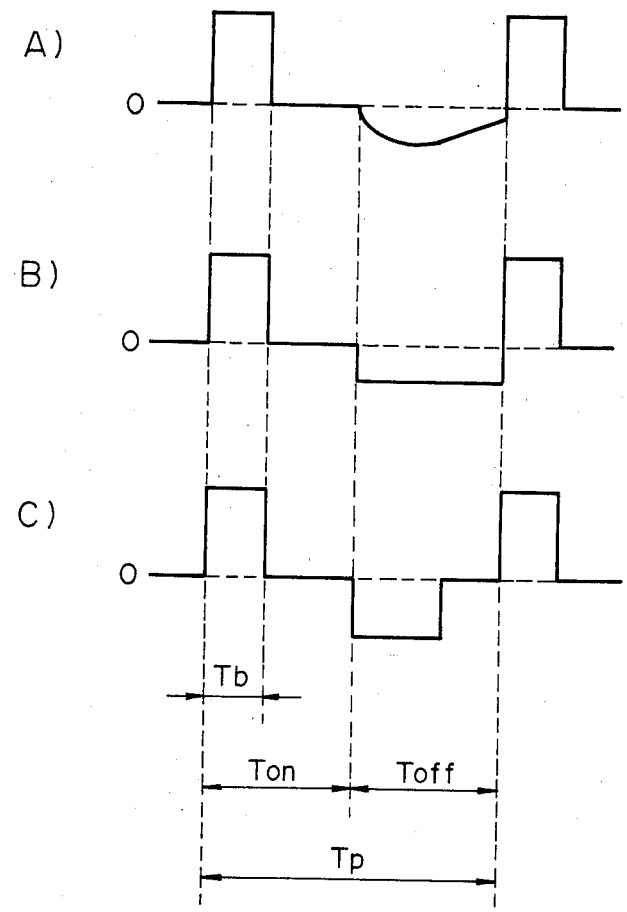
FIG. 17 shows output voltage waveforms produced from the detection coil in various reset modes.

FIG. 1 is a diagram showing a configuration of a measurement circuit according to a measurement method embodying the present invention. In this circuit, an object magnetic core 2 has a second detection coil 18 connected to a pulse duration detection circuit 19 (labelled PDC in FIG. 1). The pulse duration detection circuit 19 detects the duration ($T_b$ in a FIG. 12) of the gate period of the voltage induced in the second detection coil 18, and applies a control signal to a single-polarity rectangular wave generator 9 and a variable DC power supply 10 in such a manner as to render the magnetic density change rate $\Delta Bcm/Tb$ constant during the gate period, thereby making it possible to measure the dependency of the magnetic core loss Pc on the operating magnetic flux density amount $\Delta Bcm$ during the minor loop operation while the first quadrant of the B-H curve of the object magnetic core 2 is in a saturated region with $\Delta Bcm/Tb$ as a parameter. The operation of the other parts of the configuration in this circuit is similar to the operation of the measurement circuit shown in FIG. 10. The change rate of magnetic fluxes during the reset period is shown in FIG. 17. The change rate is different for (A) constant current reset, (B) DC-type reset, and (C) S-type reset, and therefore the magnetic core loss also depends on the respective reset conditions, which are controllable by appropriately setting the variable DC power supply 10 and the control circuit impedance 11.

The constant current reset, DC-type reset and S-type reset are classified according to the manner of resetting a magnetic amplifier. The constant current reset is defined as a resetting under constant current conditions, DC-type reset as a resetting under constant voltage (also called a "constant voltage reset"), and S-type reset as a setting against free magnetization conditions. For detail, see "Magnetic Application Engineering" by Murakami, p.p. 26 to 32, published by Asakura Shoten, 1984, and Technological Report of the Institute of Electrical Engineers of Japan, No. 47, p.p. 13 to 18, 1961.

Figure 7:
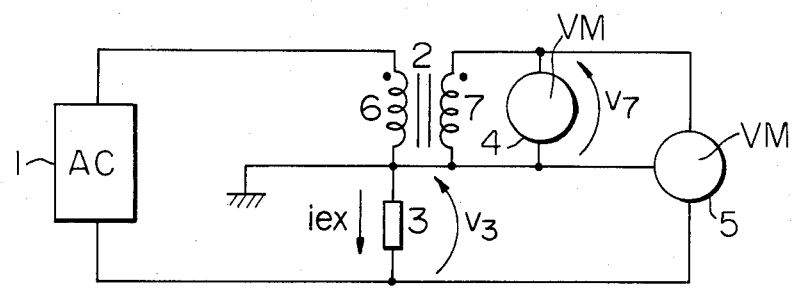
Figure 8:
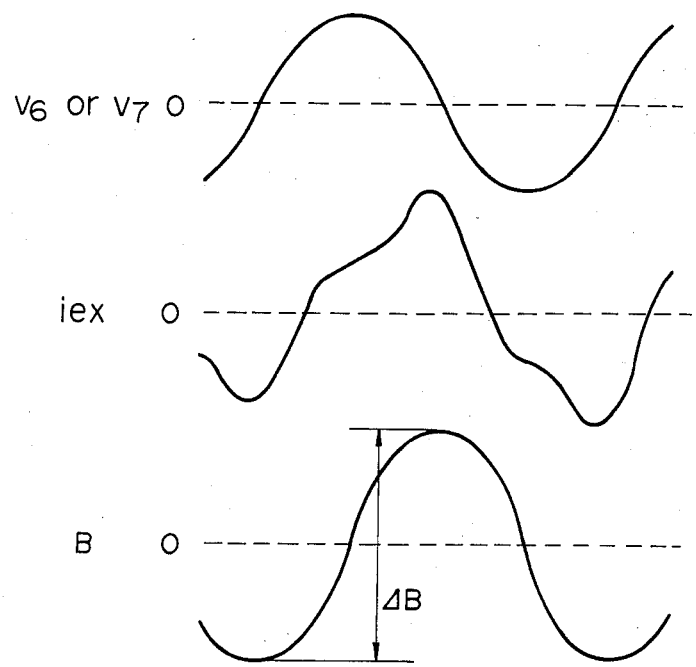
FIG. 8 is a diagram showing waveforms produced at various parts under sinusoidal wave drive in the measurement circuits of FIGS. 6 and 7.
Figure 9:
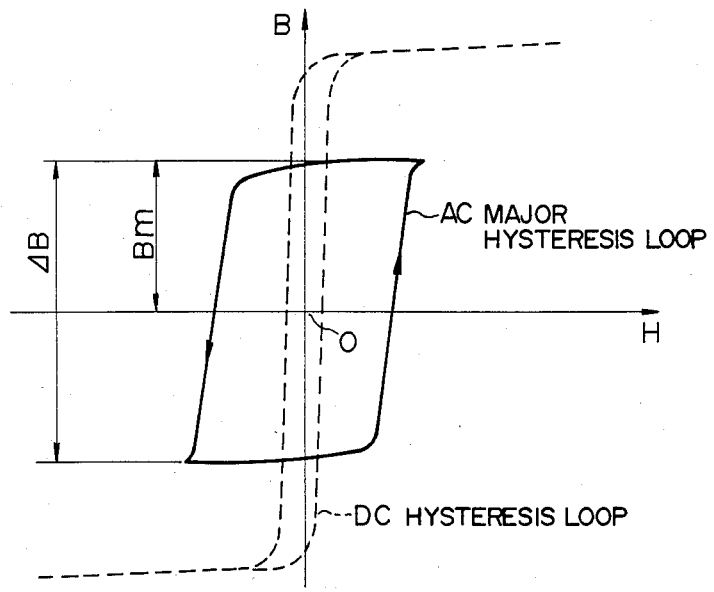
FIG. 9 shows a B-H hysteresis loop representing the operation of a magnetic core in the measurement circuits of FIGS. 6 and 7.
Figure 14:
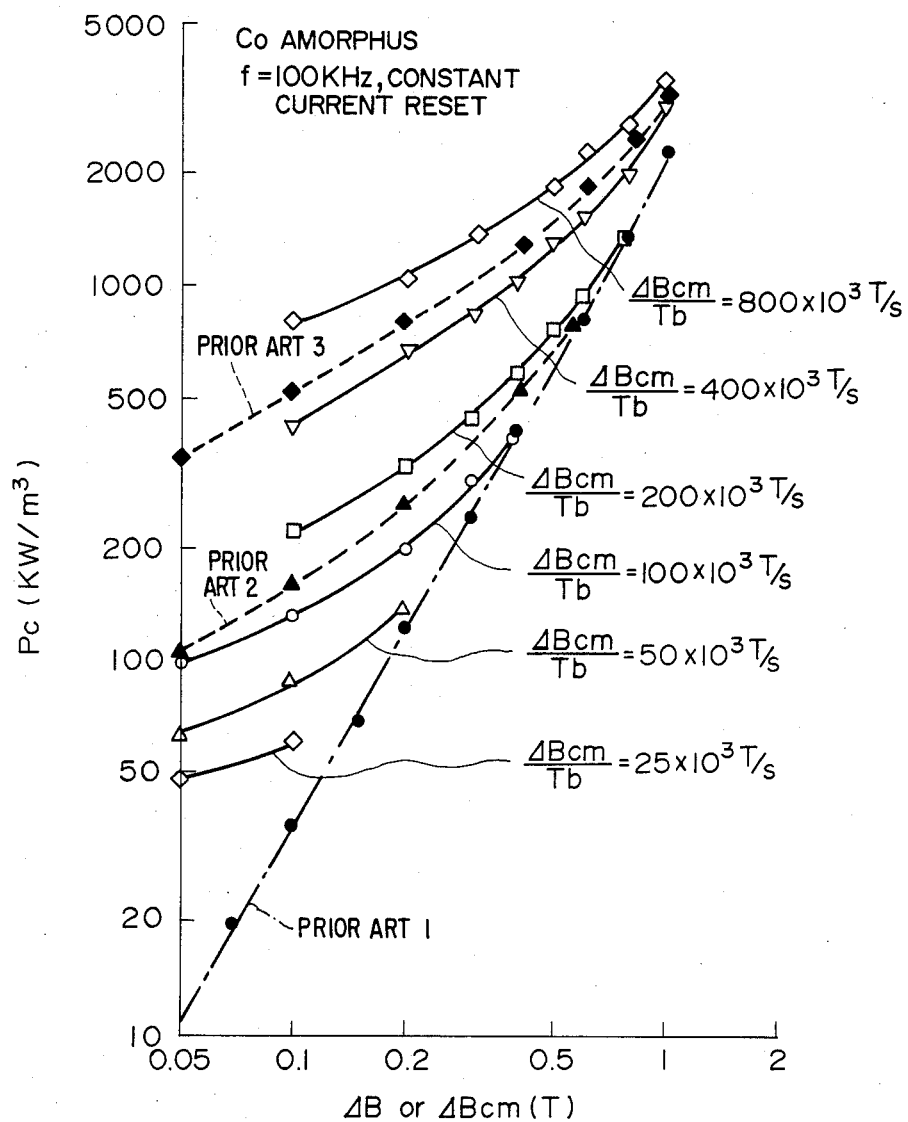
FIG. 14 is a diagram showing the relationship between the Pc of the Co amorphous and $\Delta B$ in the method of measurement according to the present invention.
Figure 15:
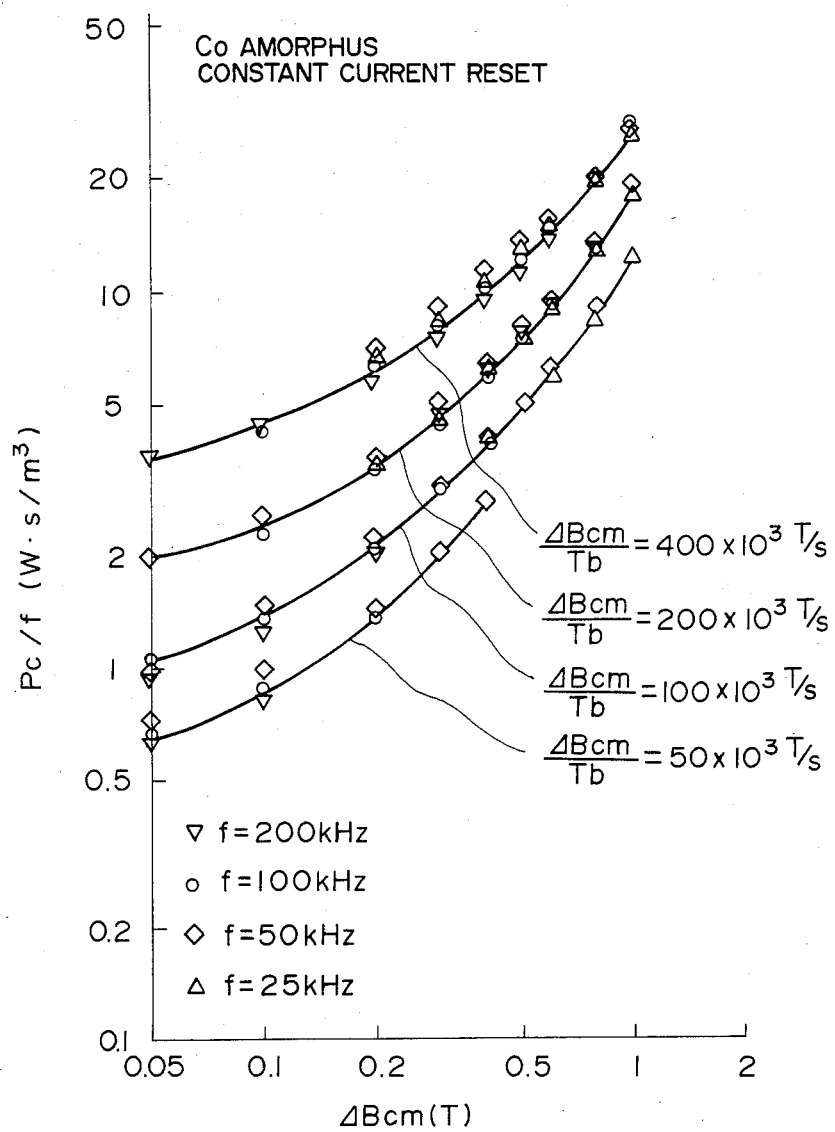
FIG. 15 is a similar diagram showing the dependency of Pc/f on $\Delta Bm$.
Figure 16:
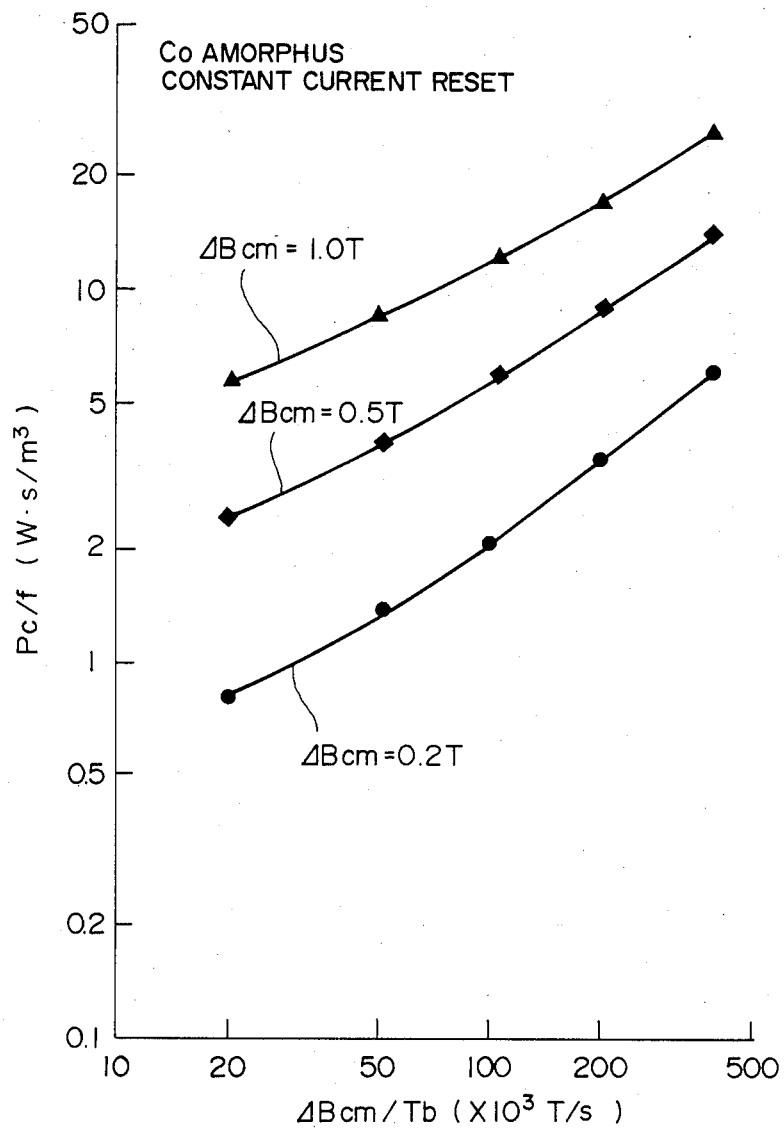
FIG. 16 is a similar diagram showing the relationship between Pe/f and $\Delta Bcm/Tb$.

In FIG. 14, measurement data (solid lines) of the dependency of the magnetic core loss Pc of a magnetic core wound with a Co amorphous on the operating magnetic flux density $\Delta Bcm$ during the constant-current reset with a frequency f of 100 KHz and an on-duty factor D of 0.5 measured according to the method of the present invention is compared with the prior art with the magnetic flux density change rate during the gate period ΔBcm/Tb as a parameter. The prior art 1 is a measurement result under the bipolar rectangular wave drive of the measurement shown in FIG. 7, and the prior arts 2 and 3 the result obtained by the measurement circuit shown in FIG. 10. The prior art 3 uses a non-inductive load resistor 17 six times larger than that used in the prior art 2. As seen from this diagram, the prior art 1 is greatly different from the magnetic core loss of the saturable reactor magnetic core in an actual operation of a magnetic amplifier. In the prior arts 2 and 3, on the other hand, the measurement greatly depends on the effect of measurement conditions and it is very difficult to clearly define the measurement conditions. The prior arts 1 to 3 cannot therefore be utilized for the designing of an actual saturable reactor. According to the present invention, by contrast, the magnetic core loss Pc is realizable with the magnetic flux density change rate ΔBcm/Tb during the gate period as a parameter. Also, a study of the dependency of the magnetic core loss Pc/f on the operating magnetic flux density amount ΔBcm per cycle with ΔBcm/Tb as a parameter shows, as in FIG. 15, that the measurements, in spite of some variations, are substantially constant when ΔBcm/Tb is used instead of the frequency f as a parameter. FIG. 16 shows the dependency of the magnetic core loss Pc/f on the magnetic flux density change rate ΔBm/Tb during the gate period with ΔBcm measured by the method according to the present invention as a parameter. The measurement data of FIGS. 14 to 16 are based on definite excitation conditions for the object magnetic core, and therefore direct application thereof to the design of an actual saturable reactor is possible.

(Embodiment 2)

Figure 2:
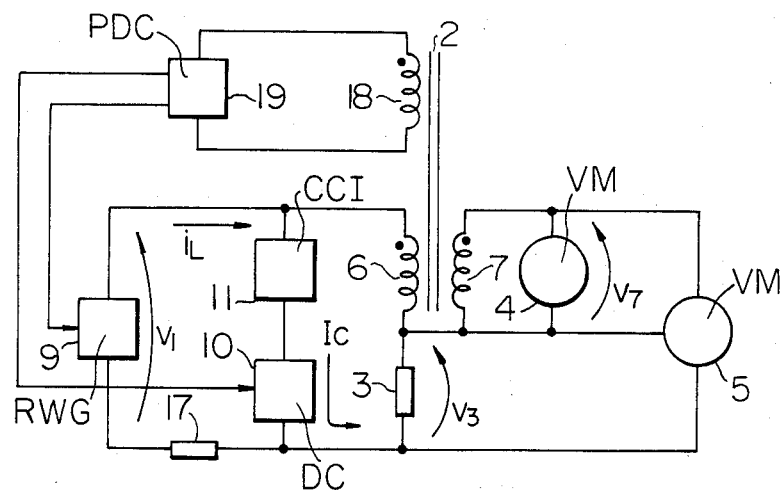
FIG. 2 is a diagram showing a configuration according to another embodiment for the same method of measurement as in FIG. 1.
Figure 3:
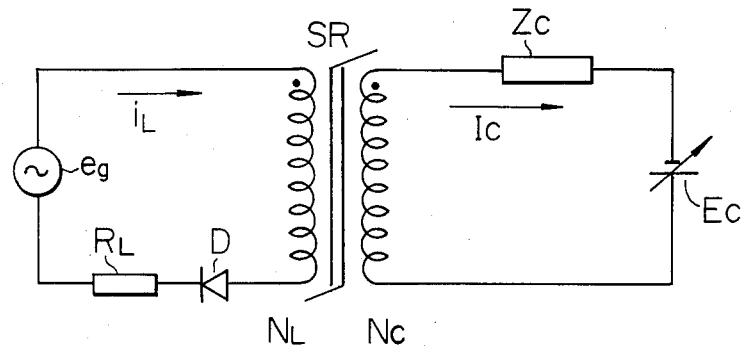
FIG. 3 shows a basic circuit of a half-wave magnetic amplifier.
Figure 4:
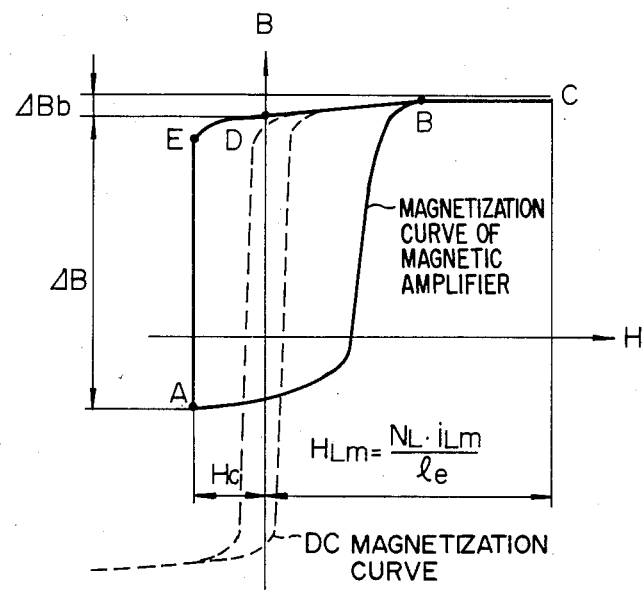
FIG. 4 shows an operation magnetization curve of a saturable reactor in the basic circuit shown in FIG. 3.
Figure 5:
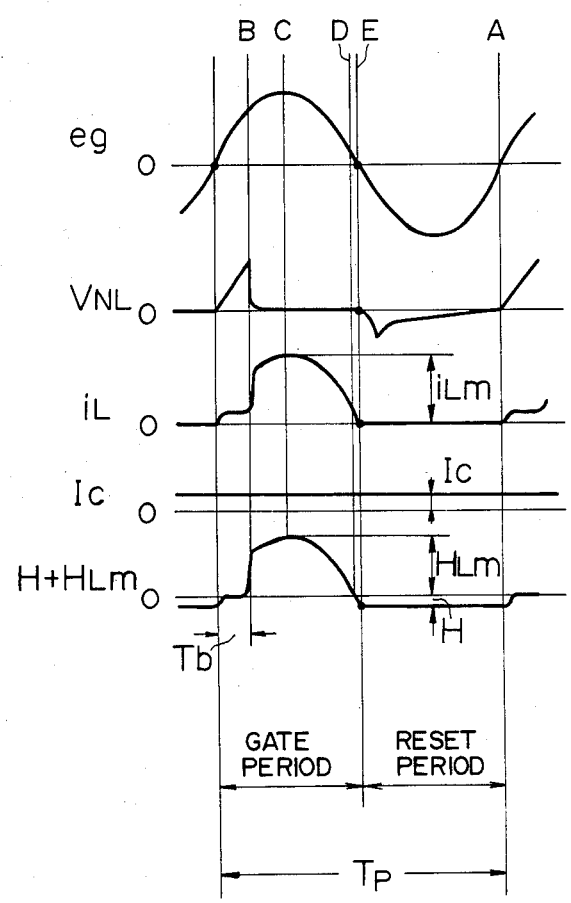
FIG. 5 is a diagram showing operation waveforms produced at various parts of the basic circuit of FIG. 3.
Figure 6:
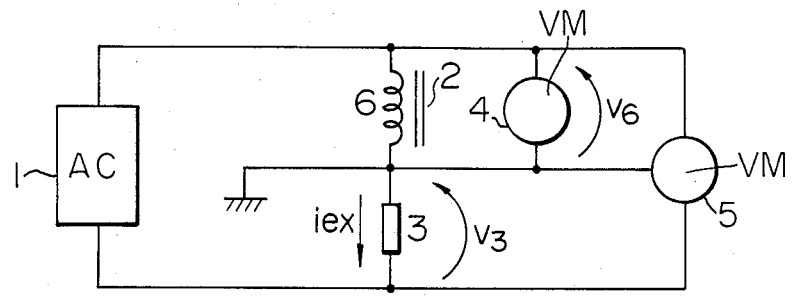
FIGS. 6 and 7 are diagrams showing a configuration for a conventional method of measurement during major loop operation.

FIG. 2 is a diagram showing a configuration for the measurement method according to another embodiment of the present invention. In this circuit, the gate coil 6 of the object magnetic core 2 is provided with the function of a set coil, and the operation thereof is similar to that of FIG. 1.

In the measurement method according to the present invention, if a measurement is taken with a constant magnetic flux density change rate with the reset current at zero, it is possible to obtain measurement data on the magnetic core loss that can be directly applied to the design of a transformer for forward converter or a transformer for a flyback converter.

It will thus be seen from the foregoing description that according to the present invention (RCMC method), measurement of the magnetic core loss in the case where only the first quadrant of a B-H loop is in a saturated region in a minor loop plotted by a saturable reactor magnetic core for a magnetic amplifier is made possible unlike in the conventional CMC method, while making the measurement conditions define. Further, it is possible to obtain a measurement result on the magnetic core loss that is directly applicable to the design of an actual saturable reactor. Furthermore, the measurement result on the magnetic core loss obtained according to the present invention is directly utilized for design of a transformer for forward converter or flyback converter.

We claim:

1. A method for measuring a magnetic core loss Pc experienced by a magnetic core during minor loop operation that includes a saturation region, comprising the steps of:
   exciting said magnetic core with a rectangular wave voltage;
   measuring the core loss Pc of said core while excited by said rectangular wave voltage;
   measuring a magnetic flux density change rate magnitude experienced in said magnetic core while said core loss is being measured, said flux density change rate magnitude being determined by said rectangular wave voltage; and
   associating with said measured core loss as a parameter thereof the measured flux density change rate magnitude.

2. The method for measuring magnetic core loss according to claim 1 wherein said core loss measuring step is performed by multiplying an exciting current $i_{ex}$ of said magnetic core by as terminal voltage of a winding mounted on said magnetic core.

3. The method for measuring magnetic core loss according to claim 1 wherein said core loss measuring step is performed by adding a value obtained by multiplying a gate current $i_L$ of said magnetic core by a terminal voltage of a winding mounted on the magnetic core, to a value obtained by multiplying a reset current of said magnetic core by said terminal voltage of said winding mounted on said magnetic core.

4. The method for measuring magnetic core loss according to claim I wherein the magnetic core loss Pc is measured by fixing the magnetic flux density change rate during a gate period.

5. The method for measuring magnetic core loss according to claim 1 comprising the additional steps of:
   detecting a duration Tb of a voltage induced in a coil wound on said magnetic core during a gate period Ton;
   detecting an operating magnetic flux density of said magnetic core,; and
   setting a change rate of the magnetic flux density to a predetermined value by controlling one of an input voltage, a reset current and a load resistor.

6. A method for measuring magnetic core loss experienced in a magnetic core operated in a minor hysteresis loop including a saturation region, comprising the steps of:
   exciting said magnetic core with a controllable voltage having a rectangular waveform;
   further exciting said magnetic core with a controllable reset current;
   measuring a first portion of said core loss experienced during a gate period of said rectangular waveform;
   measuring a second portion of said core loss experienced during a reset period of said rectangular waveform;
   sensing a voltage induced in a winding on said magnetic core during said gate period;
   controlling said rectangular waveform and said reset current to achieve a predetermined constant magnetic density change rate of said magnetic core during said gate period;
   summing said first and second core loss portions to determine a total core loss portion; and
   associating said predetermined magnetic density change rate as a parameter with said total core loss.

7. The method for measuring magnetic core loss according to claim 6 wherein said first core loss portion is computed by multiplying an exciting current $i_{ex}$ of said magnetic core by a voltage induced in a second winding on said magnetic core.

8. The method for measuring magnetic core loss according to claim 6 wherein said rectangular voltage waveform and said reset current are respectively applied to first and second exciting windings of said magnetic core.

9. The method for measuring magnetic core loss according to claim 6 wherein said first core loss portion is measured by multiplying a gate current of said magnetic core by a terminal voltage of a second winding on said magnetic core; and said second core loss portion being measured by multiplying a reset current of said magnetic core by the terminal voltage of said second winding.

* * * * *